United States Patent [19]

Pacor

[11] 4,117,507
[45] Sep. 26, 1978

[54] DIODE FORMED IN INTEGRATED-CIRCUIT STRUCTURE

[75] Inventor: Bruno Pacor, Cornaredo (Milan), Italy

[73] Assignee: SGS-ATES Componeti Elettronici S.p.A., Agrate Brianaza (Milan), Italy

[21] Appl. No.: 808,369

[22] Filed: Jun. 20, 1977

[30] Foreign Application Priority Data

Jun. 22, 1976 [IT] Italy .............................. 24531 A/76
Jun. 25, 1976 [IT] Italy .............................. 24696 A/76

[51] Int. Cl.$^2$ ............................................ H01L 27/04
[52] U.S. Cl. ........................................ 357/48; 357/35; 357/40; 357/86
[58] Field of Search ...................... 357/48, 86, 35, 40

[56] References Cited

U.S. PATENT DOCUMENTS

| | | | |
|---|---|---|---|
| 3,590,345 | 6/1971 | Brewer | 317/235 E |
| 3,969,748 | 7/1976 | Horil | 357/46 |
| 4,027,325 | 7/1977 | Genesi | 357/48 |
| 4,047,220 | 9/1977 | Ferro | 357/48 |

*Primary Examiner*—Martin H. Edlow
*Attorney, Agent, or Firm*—Karl F. Ross

[57] ABSTRACT

An IC chip with a substrate 10 of one conductivity type (P), overlain by an epitaxially grown layer 12 of the opposite conductivity type (N), includes a diode formed in part by a region 16 of that layer separated from other such isolated regions by a barrier 14 of the first conductive type (P), the remainder of the diode being constituted by an insular central zone 18 of the first conductivity type (18) within that region. To minimize leakage losses when the diode is forwardly biased, a low-resistance zone 22, 32 of the second conductivity type (N+) is interposed between the central zone 18 and the barrier 14, joining a buried low-resistance stratum 30 of the same conductivity type (N+) which lies between region 16 and substrate 10. A first diode electrode (anode) 34 is formed by a metallic coating 34 which covers an upper surface of central zone 18 but is in contact, over most of its area, with an annular low-resistance section 36 of the second conductivity type (N+) embedded in that zone to reduce the number of charge carriers (holes) injected into the diode during forward conduction. A second diode electrode (cathode) consists of a metallic coating 24, 24' in contact with the low-resistance zone 22, 32 surrounding the central zone 18. Between these two zones lies an annular collector zone 40, 40' of the first conductivity type (P) in contact with the second electrode 24', or with an extension 24" thereof, which may extend the buried stratum 30 and which further reduces the flow of charge carriers (holes) toward the substrate during forward conduction.

10 Claims, 6 Drawing Figures

DIODE FORMED IN INTEGRATED-CIRCUIT STRUCTURE

FIELD OF THE INVENTION

My present invention relates to a monolithic semiconductor structure wherein portions of different conductivity types (P,N) constitute the anode and the cathode of a diode in an integrated circuit which may comprise other elements such as transistors.

BACKGROUND OF THE INVENTION

In the manufacture of integrated circuits of this kind, a substrate of a semiconductor material such as silicon of one conductivity type (e.g. P) is formed, usually by epitaxial growth, with an overlying layer of the opposite conductivity type (N) subdivided, by barrier zones of the first conductivity type (P), into several regions wherein the various circuit elements such as transistors, diodes, capacitors and resistors can be formed by the selective introduction of impurities through suitable masks of silicon oxide, for example. Thus, an intermediate or insular zone of the first conductivity type (P) within such an isolated region can serve as the base of an NPN transistor (or PNP transistor if the conductivity types were interchanged) whose emitter is constituted by a section of the second conductivity type, preferably of higher impurity concentration (N+), embedded in that zone. The collector of the transistor, represented by the surrounding region of the same conductivity type (N), may include a low-resistance zone with a higher impurity concentration (N+) similar to that of the emitter.

Such an isolated zone of the same conductivity type as the substrate, but separated therefrom by a part of the overlying epitaxial layer, can also be used as a portion of a diode whose remainder is constituted by the isolated region of this layer in which that zone is received. A diode of this description may have a relatively high reverse-voltage threshold e.g. of about 55 V, suitable for use in a power stage of an amplifier also including a transistor as described above. A problem arising in these instances, however, resides in the fact that the diode forms with the substrate a parasitic transistor (in the assumed instance of PNP type) which tends to generate an appreciable leakage current when the diode is biased for forward conduction. This is true because, as a rule, the junction between the substrate and the epitaxial layer is reverse-biased to minimize conduction thereacross and to reduce the effect of stray capacitances existing between that junction and ground.

Various solutions have already been proposed for limiting that leakage current by restricting the flow of charge carriers from the diode toward the substrate. One such solution consists in creating, prior to the formation of the epitaxial layer, a low-resistance stratum of the same conductivity type (N+) buried between that layer and the substrate, generally within the confines of the barrier surrounding the isolated region. According to another earlier proposal, the low-resistance zone of like conductivity type (N+) included in the isolated region is extended into contact with the buried stratum so as virtually to enclose, from a distance, the isolated zone of the other conductivity type (P) by a shell capable of neutralizing the charge carriers (holes) injected into the isolated region by the forwardly biased intermediate zone. Even with these precautions, however, the aforementioned parasitic transistor can still drain significant amounts of charge carriers from the forwardly conducting diode, especially in the case of linear integrated power circuits.

OBJECT OF THE INVENTION

The object of my present invention, therefore, is to provide a further improvement in such an integrated-circuit structure designed to suppress these leakage currents to the greatest possible extent.

SUMMARY OF THE INVENTION

I realize this object, pursuant to one feature of my invention, by the provision of a low-resistance section of the opposite conductivity type (e.g. N) embedded in the intermediate or insular zone adjacent the surface thereof remote from the substrate, referred to hereinafter at its uppersurface, that section occupying the major part of the area contacted by a first metallic coating forming one of the electrodes of the diode; the other diode electrode is constituted by a second metallic coating on the upper surface of the low-resistance zone included in the surrounding isolated region. Thus, the first metallic coating is in direct contact with only a small part of the intermediate zone, preferably at the center of the annular embedded section of opposite conductivity type, with consequent reduction in the number of charge carriers that can be injected from that electrode into the forwardly conducting diode.

Pursuant to another feature of my invention, advantageously utilized jointly with the one just described, a collector zone of the same conductivity type as the substrate is interposed within the isolated region of the epitaxial layer between its low-resistance zone and its intermediate or insular zone, this collector zone being in contact with a metal layer which is conductively connected to the second metallic coating and may in fact form an integral extension thereof. As will be shown in detail hereinafter, the collector zone forms with the emitter and the base of the parasitic transistor a virtual transistor of the same conductivity type (PNP in the example given above) which promotes the transmission of charge carriers from the forwardly biased intermediate zone to the second electrode of the diode.

BRIEF DESCRIPTION OF THE DRAWING

The above and other features of my invention will now be described in detail with reference to the accompanying drawing in which.

SPECIFIC DESCRIPTION

Figure 1:
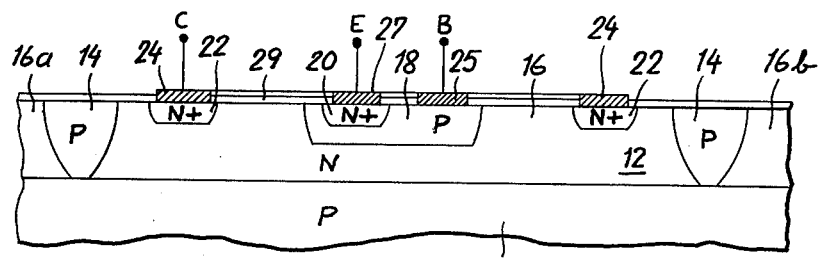
FIG. 1 is a fragmentary sectional view of an IC chip, illustrating a transistor and a diode conventionally formed in an isolated region thereof.

In FIG. 1 I have shown a representative part of a monlithic semiconductor structure, i.e. a silicon chip, comprising a substrate 10 of P-type conductivity overlain by an epitaxially grown layer 12 of N-type conductivity whose free upper surface is covered by a layer 29 of silicon oxide. A barrier 14 of P-type material, which may comprise several transverse strips or may form a continuous annular zone, isolates a region 16 of layer 12 from other regions 16a, 16b thereof. Substantially midway within region 16 there is shown an insular zone 18 of P-type conductivity, with an embedded low-resistance section 20 of N+ type. A similar low-resistance zone 22, also with a high concentration of negative charge carriers, spacedly surrounds the central zone 18 and is in conductive contact with a metallic coating 24 penetrating the oxide layer 29. Similar metallic coatings 25 and 27 are in direct contact with zone 18 and section 20, respectively. The three coatings 24, 25 and 27, connected to respective terminals C, B and E, are the collector, base and emitter electrodes of an NPN power transistor. With terminal E left unconnected, zones 18 and 16/22 can be operated as a diode whose anode is the electrode 25 and whose cathode is the electrode 24.

Figure 2:
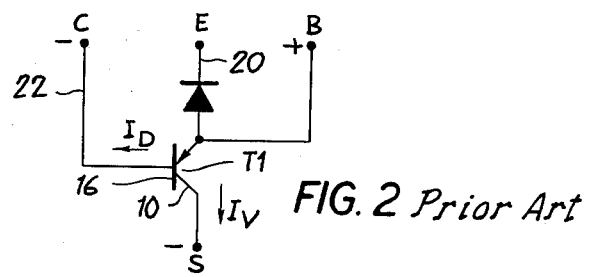
FIG. 2 is a diagram showing the equivalent circuit of the transistor and diode illustrated in FIG. 1.

In the equivalent circuit of FIG. 2, terminals B and C have zones connected to positive and negative voltage, respectively, to indicate this mode of operation. A diode D symbolizes the N/P junction existing between section 20 and zone 18. With a terminal S of substrate 10 also connected to negative potential, a parasitic transistor T1 of PNP type is formed with an emitter terminal B, a base terminal C and a collector terminal S. The voltages applied to these terminals, designed to bias the diode 18, 16/22 in the forward direction so as to cause the flow of a current $I_D$, also renders this parasitic transistor T1 conductive with the result that a leakage current $I_V$ passes from terminal B to terminal S. The relationship between these two currents is given by $$I_V = h \cdot I_D$$

where $h$ is the gain factor of the parasitic transistor. Even if this gain factor is relatively low, e.g. between 1 and 3, potential differences of several tens of volts between terminals B and C will give rise to appreciable values of current $I_V$.

Figure 3:
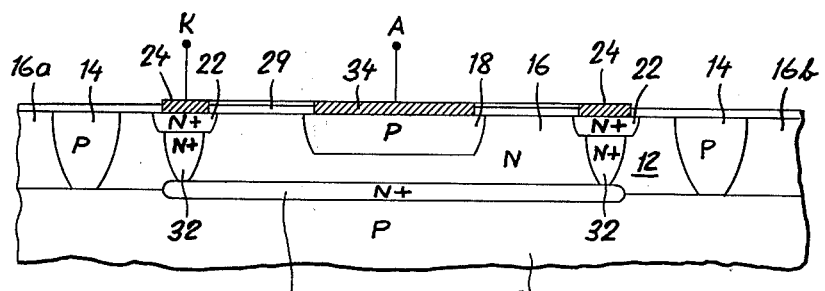
FIG. 3 is a view similar to FIG. 1, illustrating the aforedescribed prior-art measures for reducing leakage currents.

In FIG. 3, the two electrodes 25 and 27 of FIG. 1 have been replaced by a single metallic coating 34 connected to an anode terminal A whereas collector terminal C has been transformed into a cathode terminal K; the structure is otherwise identical with that shown in FIG. 1, except for the provision of a buried stratum 30 of N+ type between substrate 10 and epitaxial layer 16 as well as a downward extension 32 of annular zone 22 to contact and merge with that stratum. These well-known measures are designed to reduce the flow of positive charge carriers or holes from zone 18 to substrate 10, either directly or by way of barrier 14, as already explained.

Figure 4:
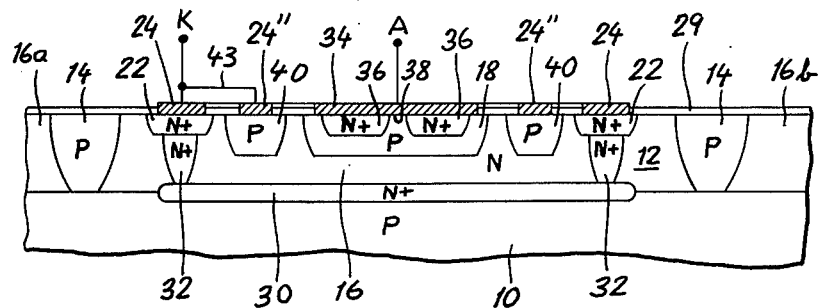
FIG. 4 is a further view similar to FIG. 1, showing the structure of FIG. 3 modified in accordance with one aspect of my invention.

In accordance with a feature of my present invention, and as illustrated in FIG. 4, the anode coating 34 directly contacts the zone 18 only along a small fraction of its area, left free by an annular low-resistance section 36 otf the same conductivity type N+ as zones 22, 30 and 32. This embedded section 36, well separated from the surrounding region 16 of N-type layer 12, limits the injection of positive charge carriers from anode 34 into zone 18 and consequently reduces the residual leakage current $I_V$ shown in FIG. 2. Thus, the major part of the area of the silicon body covered by coating 34 is occupied by N+ material whose presence is not detrimental to the high reverse threshold of the diode. A minor increase in the forward resistance of the diode is generally without practical importance.

It should be noted that the formation of N+ section 36 usually coincides with that of collector areas 22 and emitter areas 20 (see FIG. 1), in various parts of the chip, by the concurrent diffusion of suitable impurities into the corresponding areas so that no additional step is required in the manufacture of the IC structure. Thus, the depth of all these N+ zones is substantially the same. The concentration of the negative charge carriers so introduced will be highest in the immediate vicinity of electrode 34 where the positive charge carriers of zone 18 are also predominantly concentrated. The narrow passage surrounded by the annular section 36 assures a high probability of interception of centrally injected positive charge carriers by the stratum 30 if these carriers migrate toward substrate 10 instead of being drawn toward cathode 24.

Figure 5:
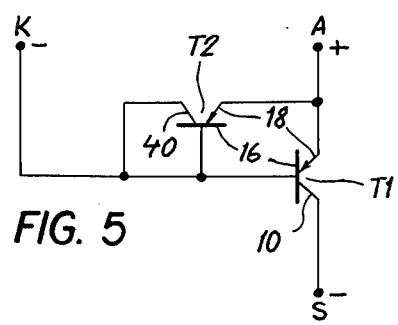
FIG. 5 is a diagram showing the equivalent circuit for the structure of FIG. 4.

According to another feature of my invention, also shown in FIG. 4, an annular P-type zone 40 spacedly surrounds the central zone 18 inwardly of cathode zone 32 and is in conductive contact with a metal layer 24", the latter being tied to terminal K by a lead 43 so as to form an electrical extension of cathode 24. As indicated in the diagram of FIG. 5, zone 40 constitutes the collector of a virtual PNP transistor T2 having the same base 16 and the same emitter 18 as the parasitic transistor T1. The effect of this virtual transistor T2, upon forward biasing of terminals A and K, is to draw positive charge carriers from anode terminal A toward cathode terminal K in lieu of letting them pass through parasitic transistor T1 toward terminal S. Collector zone 40 may be formed concurrently without requiring any additional steps in the manufacture of the chip, with central zone 18, the two zones being thus of the same depth as shown in FIG. 4.

Figure 6:
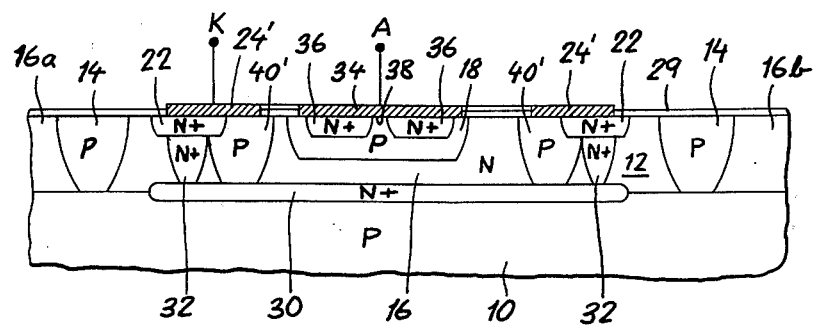
FIG. 6 is a view similar to FIG. 4 with further modifications representing another aspect of my invention.

In FIG. 6 I have shown a modified semiconductor structure differing from that of FIG. 4 by an extension of the collector zone, here designated 40', to the buried N+ stratum 30. Zone 40' is shown to be contiguous with zone 22, 32 and may be formed concurrently therewith as well as with barrier 14, again with no additional manufacturing step, the three zones being of substantially the same depth. The two metal foils 24, 24" of FIG. 4 have here been replaced by an integral annular coating 24' overlying zones 22 and 40'.

I claim:
1. An integrated semiconductor structure comprising:
a substrate of one conductivity type;
an overlying layer of the opposite conductivity type on said substrate;
a barrier of said one conductivity type extending to said substrate from a remote surface of said overlying layer and bounding an isolated region of said overlying layer constituting a first diode portion;
an intermediate zone of said one conductivity type in said region separated from said substrate constituting a second diode portion adjacent said remote surface;
a low-resistance zone of said opposite conductivity type spacedly interposed within said region between said intermediate zone and said barrier next to said remote surface;
a first metallic coating at said remote surface on said intermediate zone;
a second metallic coating at said remote surface on said low-resistance zone; and a low-resistance section of said opposite conductivity type embedded in said intermediate zone adjacent said remote surface, said section occupying the major part of the area contacted by said first metallic coating.

2. A semiconductor structure as defined in claim 1 wherein said section is annular and surrounds a small area of direct contact between said intermediate zone and said first metallic coating.

3. A semiconductor structure as defined in claim 1 wherein said low-resistance zone is annular and surrounds said intermediate zone.

4. A semiconductor structure as defined in claim 1, further comprising a low-resistance stratum of said opposite conductivity type buried between said substrate and said overlying layer.

5. A semiconductor structure as defined in claim 4 wherein said low-resistance zone extends to said stratum.

6. A semiconductor structure as defined in claim 1, further comprising a collector zone of said one conductivity type interposed within said region between said low-resistance zone and said intermediate zone, said collector zone being in contact with a metal layer conductively connected to said second metallic coating.

7. An integrated semiconductor structure comprising:
a substrate of one conductivityb type;
an overlying layer of the opposite conductivity type on said substrate;
a barrier of said one conductivity type extending to said substrate from a remote surface of said overlying layer and bounding an isolated region of said overlying layer constituting a first diode portion;
an intermediate zone of said one conductivity type in said region, separated from said substrate, constituting a second diode portion adjacent said remote surface;
allow-resistance zone of said opposite conductivity type spacedly surrounding said intermediate zone within said region between said intermediate zone and said barrier next to said remote surface;
a first metallic coating at said remote surface on said intermediate zone;
a second metallic coating at said remote surface on said low-resistance zone; and
a collector zone of said one conductivity type interposed within said region between said low-resistance zone and said intermediate zone, said collector zone being in contact with a metal layer conductively connected to said second metallic coating.

8. A semiconductor structure as defined in claim 7 wherein said metal layer is physically separated from said second metallic coating.

9. A semiconductor structure as defined in claim 7 wherein said collector zone adjoins said low-resistance zone, said metal layer being an extension of said second metallic coating.

10. A semiconductor structure as defined in claim 9, further comprising a low-resistance stratum of said opposite conductivity type buried between said substrate and said overlying layer, said low-resistance zone and said collector zone extending to said stratum.

* * * * *